(12) United States Patent
Dickey

(10) Patent No.: US 12,022,607 B2
(45) Date of Patent: Jun. 25, 2024

(54) NOISE CONTROL FOR PRINTED CIRCUIT BOARD

(71) Applicant: Hamilton Sundstrand Corporation, Charlotte, NC (US)

(72) Inventor: John A. Dickey, Caledonia, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 295 days.

(21) Appl. No.: 17/670,235

(22) Filed: Feb. 11, 2022

(65) Prior Publication Data

US 2023/0262873 A1    Aug. 17, 2023

(51) Int. Cl.
*H05K 1/02*  (2006.01)
*H05K 1/18*  (2006.01)

(52) U.S. Cl.
CPC .......... *H05K 1/0216* (2013.01); *H05K 1/18* (2013.01)

(58) Field of Classification Search
CPC .............................. H05K 1/0216; H05K 1/18
USPC ........................................................ 327/379
See application file for complete search history.

(56) References Cited

U.S. PATENT DOCUMENTS

| | | | |
|---|---|---|---|
| 5,659,463 A | | 8/1997 | Lee |
| 5,825,146 A | * | 10/1998 | Agata ................. H05K 1/0218 318/400.27 |
| 5,907,481 A | | 5/1999 | Svardsjo |
| 6,418,039 B2 | | 7/2002 | Lentini et al. |
| 6,597,587 B1 | | 7/2003 | Poon et al. |
| 8,410,768 B2 | | 4/2013 | Huber et al. |
| 2005/0139864 A1 | | 6/2005 | Chang et al. |
| 2013/0269982 A1 | * | 10/2013 | Teofilovic ............ H05K 1/0256 174/148 |
| 2020/0136517 A1 | | 4/2020 | Dai et al. |

OTHER PUBLICATIONS

Extended European Search Report, of the European Patent Office, dated Jul. 10, 2023, in corresponding European Patent Application No. 23155888.3.

* cited by examiner

*Primary Examiner* — Tomi Skibinski

(57) ABSTRACT

In accordance with at least one aspect of this disclosure, a system can include, a printed circuit board (PCB), a controller on the PCB configured to output a gate drive signal to one or more gate drivers 106 to drive a gate 108 of a switch (e.g., a transistor), and an isolation domain. The isolation domain can be defined in the PCB between the controller and the one or more gate drivers. More specifically, the isolation domain can begin at a first moat and end at a second moat, defined between the controller and the one or more gate drivers. The isolation domain can be configured to prevent common mode noise in the gate drive signal.

20 Claims, 3 Drawing Sheets

NOISE CONTROL FOR PRINTED CIRCUIT BOARD

TECHNICAL FIELD

The present disclosure relates to noise control, and more particularly to noise control in printed circuit boards.

BACKGROUND

Typical switching power converters can have large high speed voltage and current transitions that generate significant levels of electromagnetic noise and interference. At the same time, the control circuits that perform the regulation and management of the converter are traditionally very low voltage that can be easily upset and interfered with. In order to keep the control functions operating the properly, system controllers are traditionally physically separated from the power switching portion of the converter on the board to prevent such interference.

However, this distance can cause problems for signal transfer between controllers and gate drivers because there is still the opportunity for noise to affect the signal when coupling onto gate control lines. There remains a need in the art for improved noise prevention in signals between the controller and gate driver without relying on physical placement of components on the board. This disclosure provides a solution for this need.

SUMMARY

In accordance with at least one aspect of this disclosure, a system includes, a printed circuit board (PCB), a controller on the PCB configured to output a gate drive signal to one or more gate drivers to drive a gate of a switch, and an isolation domain, including a first and second moat defined in the PCB, disposed between the controller and the one or more gate drivers, configured to prevent common mode or differential noise in the gate drive signal.

In embodiments, the controller can be disposed at a first location on the printed circuit board and the one or more gate drivers are disposed at a second location on the printed circuit board, the second location being remote from the first location. A power source can be disposed at the first location configured to provide a power signal to the isolation domain at the first moat.

The isolation domain can include a first isolation coupling at the first moat, configured to receive the gate drive signal from the controller and split the gate drive signal into a positive differential gate drive signal and a negative differential gate drive signal, forming a first differential pair, and receive the power signal from the power source and split the power signal into an isolated ground reference power signal and an isolated power signal, forming a second differential pair. In certain embodiments, the power source at the first location can be integrated with the first isolation coupling as an integrated circuit.

A first trace pair can be defined in the printed circuit board between the first moat and the second moat, configured to carry at least the differential gate drive signal from the controller to the gate driver, and a second trace pair can be defined in the printed circuit board between the first moat and the second moat, configured to carry at least the isolated ground reference power signal and the isolated power signals across the isolation domain.

In certain embodiments, the first and second trace pairs can include stacked traces. In embodiments, each of the positive differential gate drive signal, the negative differential gate drive signal, the isolated ground reference power signal, and the isolated power signal form the stacked traces. The isolated ground reference power signal can be at a bottom of the stacked trace, the negative differential gate drive signal can be atop the isolated ground reference power signal, the positive differential gate drive signal can be atop the negative differential gate drive signal, and the isolated power signal can be at a top of the stack.

A second isolation coupling can be included at the second moat, operatively connected to the first isolation coupling, across the isolation domain. The second isolation coupling can be configured to receive the first and second differential pairs, combine the first differential pair back into a single gate drive signal, and return the reference power signal to the first isolation coupling.

A switching domain can be included at the second location, the switching domain including the one or more gate drivers. One of the one or more gate drivers can be operatively connected to the second isolation coupling configured to receive the combined gate drive signal to drive the gate of the switch. A power source can be included at the second location configured to power the one of the one or more gate drivers locally.

In embodiments, the first isolation coupling can be physically closer on the printed circuit board to the first location than to the second location. In embodiments, the second isolation coupling can be physically closer on the printed circuit board to the second location than to the first location. In certain embodiments, the isolation domain is a floating isolation domain. In certain such embodiments, common mode noise is prevented from coupling between the switching domain and the controller.

In certain embodiments, a set of traces can be defined in the printed circuit board spanning the isolation domain, from a first isolation coupling at the first moat to a second isolation coupling at the second moat, the trace set carrying a gate drive signal from the controller the one or more gate drivers. The trace can include at least a four layer stacked trace such that the gate drive signal is sandwiched within the four layer stacked trace.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
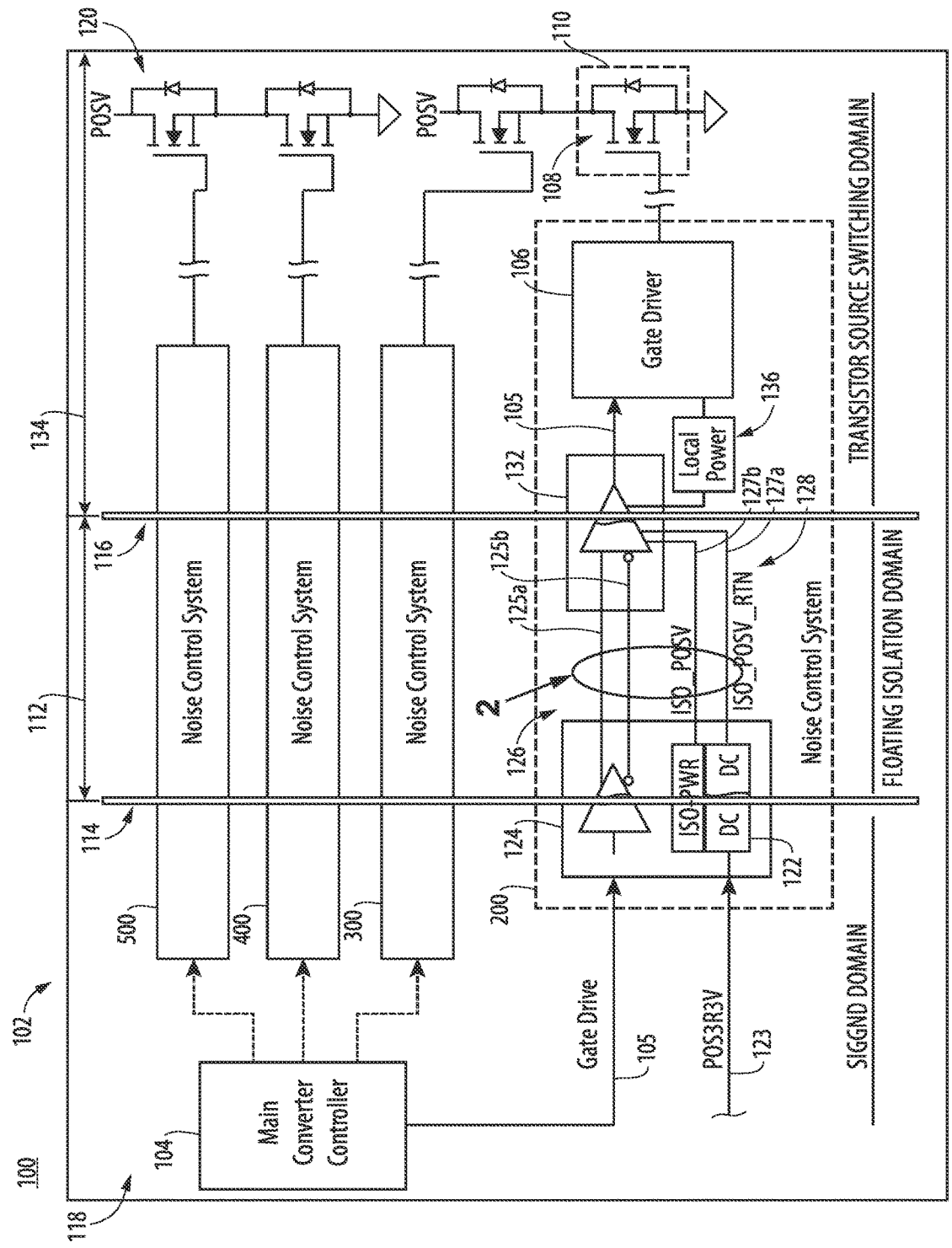
FIG. 1 is a schematic diagram of a printed circuit board in accordance with this disclosure, showing a noise control system.
Figure 2:
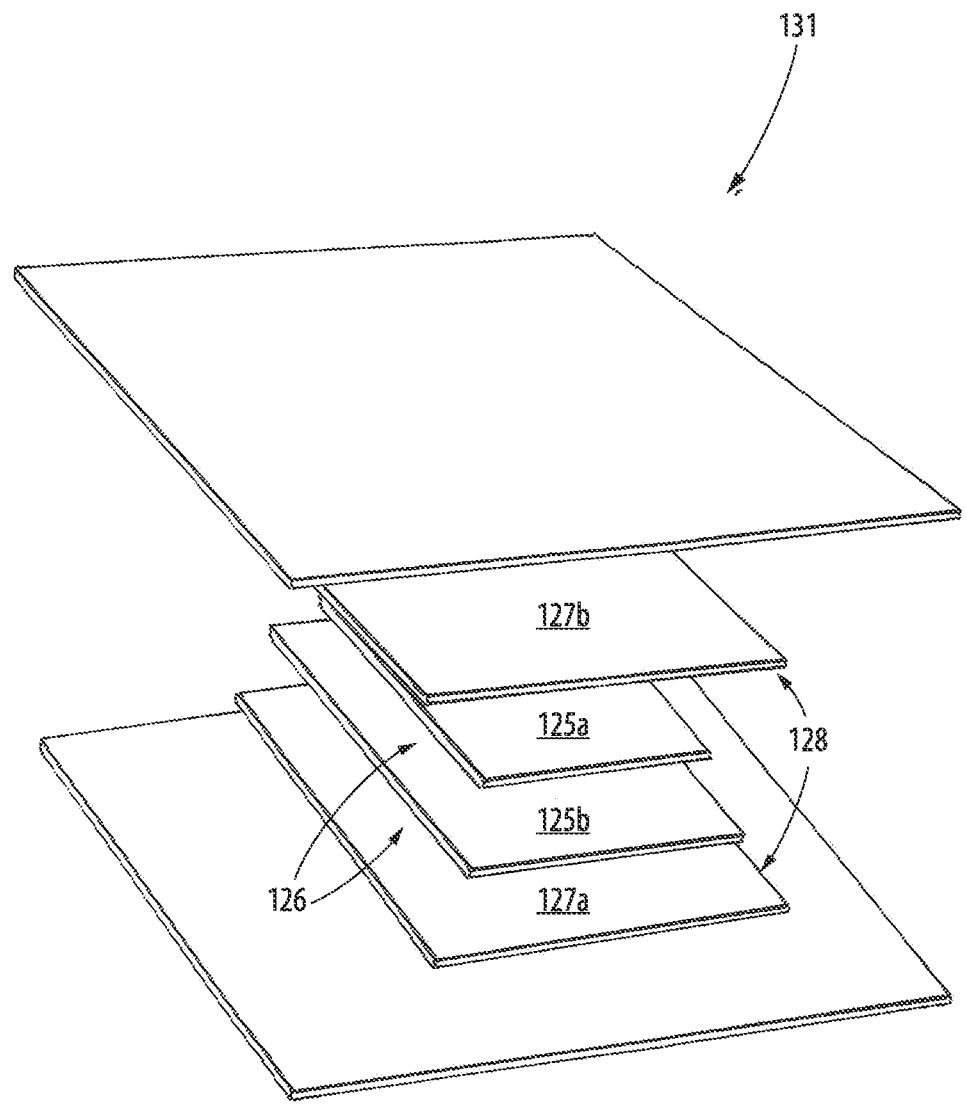
FIG. 2 is a schematic cross-sectional perspective view of the printed circuit board of FIG. 1, showing an embodiment of a differential signal distribution stackup.

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100. Other embodiments and/or aspects of this disclosure are shown in FIG. 2.

In accordance with at least one aspect of this disclosure, a system 100 can include, a printed circuit board (PCB) 102, a low voltage controller 104 on the PCB 102 configured to output a gate drive signal 105 to one or more gate drivers 106 to drive a gate 108 of a switch 110 (e.g., a transistor), and an isolation domain 112. The isolation domain 112 can be defined on the PCB 102 between the controller 104 and the one or more gate drivers 106. More specifically, the isolation domain 112 can begin at a first moat 114 and end at a second moat 116, defined between the controller 104 and the one or more gate drivers 106. The isolation domain 112 can be configured to prevent common mode noise in the gate drive signal 105. In embodiments, the isolation domain 112 can be floating.

In certain such embodiments, having all of the isolated circuits and paths floating together as a group, there can be no common mode coupling of any signal to any trace routed through the floating isolation domain 112 as there is no return path. This ensures that any noise from the gate drive (for example the high side driver that is riding up and down) does not couple back into the isolated lines and any noise that may try to be coupled onto those lines while they are in route cannot couple well to any of the isolated traces. Finally, the isolation back at the source ensures that there is still no return path for noise and no high voltage noise coupled back into the source control circuit and using that circuit as a return path resulting in a large noise loop.

As shown in FIG. 1, in embodiments, the controller 104 can be disposed at a first location 118 on the printed circuit board 102 and the one or more gate drivers 106 can be disposed at a second location 120 on the printed circuit board 102, where the second location 120 is remote from the first location 118 (e.g., the first and second locations 118, 120 are physically distant from one another across the PCB 102).

A power source 122 can be included at the first location 118 configured to provide a power signal 123 to the isolation domain 112 at the first moat 114. The power signal can be any suitable voltage, such as 3.3V or 5V, for example, depending on part requirements. In embodiments, the isolation domain 112 can further include a first isolation coupling 124 at the first moat 114, and powered by the power source 122. In certain embodiments, the power source 122 at the first location 118 can be integrated with the first isolation coupling 124, for example as an integrated circuit (e.g., as shown), however it is contemplated that the power source 122 at the first location 118 and the isolation coupling 124 may be discrete components.

The first isolation coupling 124 can be configured to receive the gate drive signal 105 from the controller 104 and split the gate drive signal 105 into a positive differential gate drive signal 125a and a negative differential gate drive signal 125b, forming a first differential pair 126. The first isolation coupling 124 can also be configured to receive the power signal 123 from the power source 122 and split the power signal 123 into an isolated ground reference power signal 127a and an isolated power signal 127b, forming a second differential pair 128.

A trace 130 (e.g., as schematically shown in FIG. 1) is defined in the PCB 102 between the first moat 114 and the second moat 116. The trace 130 can include a first stacked trace (e.g., pair 126) configured to carry at least the gate drive signal 105 from the controller 104 to the gate driver 106. The trace 130 can also include a second stacked trace (e.g., pair 128) configured to carry at least the isolated ground reference power signal 127a and the isolated power signal 127b across the isolation domain 112. In embodiments, the trace 130 can span the isolation domain 112 (e.g., an entirety of the isolation domain 112), from the first isolation coupling 124 at the first moat 114 to a second isolation coupling 132 at the second moat 116. In certain embodiments, the trace 130 can include at least a four layer stacked trace (e.g., as a stackup 131 shown in FIG. 2) such that the gate drive signal 105 (e.g., as the first differential pair 126) is sandwiched within the four layer stackup 131 as shown in FIG. 2. In embodiments, the stackup 131 as shown in FIG. 2 can be bound by a normal ground or power plane.

Figure 3:
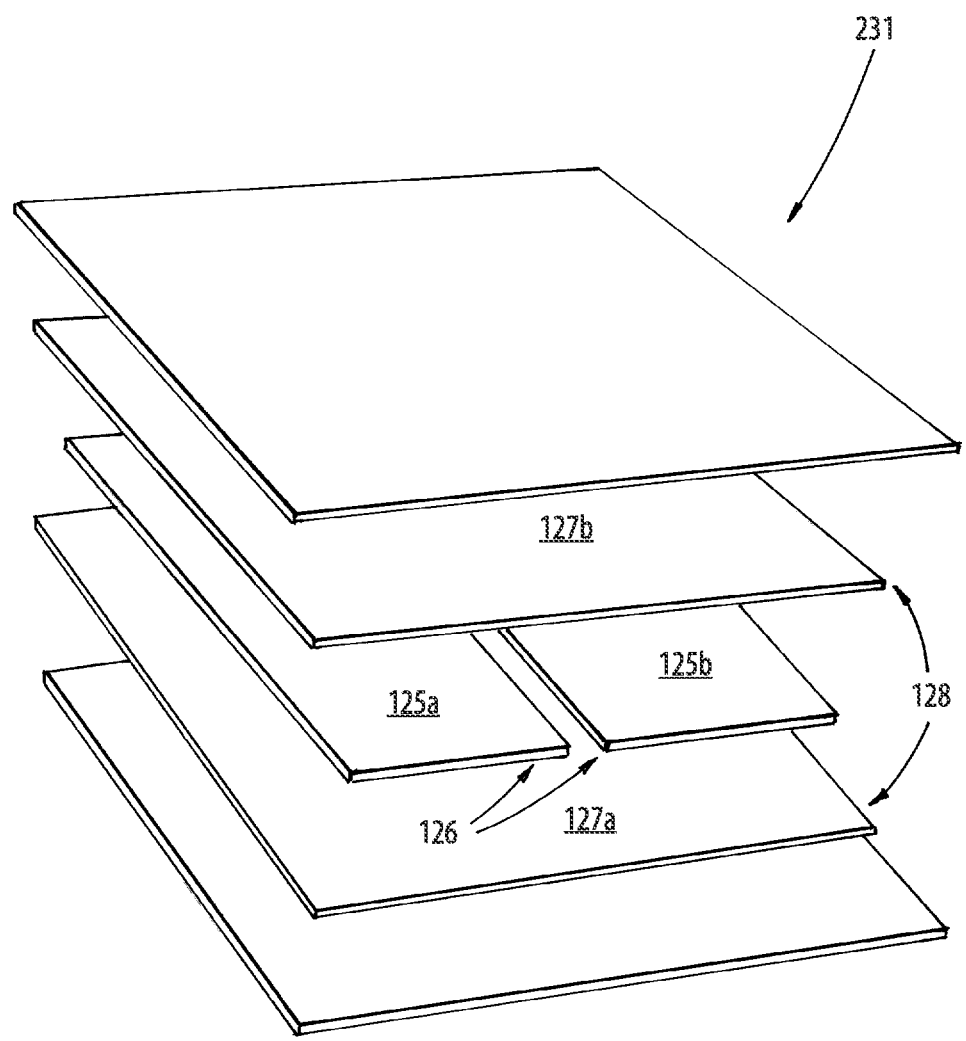
FIG. 3 is a schematic cross-sectional perspective view of the printed circuit board of FIG. 1, showing another embodiment of a differential signal distribution stackup.

As shown, each of the positive differential gate drive signal 125a, the negative differential gate drive signal 125b, the isolated ground reference power signal 127a, and the isolated power signal 127b can form the stacked trace 130, such that that the isolated ground reference power signal 127a is at a bottom of the stackup 131, the negative differential gate drive signal 125b is atop the isolated ground reference power signal 127a, the positive differential gate drive signal 125a is atop the negative differential gate drive signal 125b, and the isolated power signal 127b is at a top of the stack. In certain embodiments, such as shown in FIG. 3, the stackup 231 can be similar to stack up 131, however in stackup 231, the signals 125a and 125b can be positioned side-by-side between signals 127a and 127b, forming pair 226. As shown in both stackups 131, 231, the power signal traces 127a, 127b can be wider than the gate drive signal traces 125a, 125b to provide fringe protection.

The second isolation coupling 132 can be disposed at the second moat 116, operatively connected to the first isolation coupling 124 across the isolation domain 112 (e.g., via the trace 130). In embodiments, the second isolation coupling 132 can be configured to receive the first and second differential pairs 126, 128. The second isolation coupling 132 can be configured to combine the first differential pair 126 back into a single gate drive signal 105 and provide the gate drive signal 105 to the gate driver 106, and can be powered by reference power signal.

A high voltage switching domain 134 can be disposed at the second location 120, the switching domain 134 including the one or more gate drivers. The gate driver 106 is operatively connected to the second isolation coupling 132 being operative to receive the combined gate drive signal 105 to drive the gate 108 of the switch 110. While one or more gate drivers can be included in the switching domain 134, and driven by the main controller 104 and gate drive signal 105, it should be understood that each gate driver 106 in the switching domain 134 includes its own isolation domain 112 and noise control system 200, 300, 400, 500. The second isolation coupling 132 cancels out any noised picked up in the gate drive signal 105 as pair 126. This is because the differential trace pair 126 places signals 125a, 125b so close together that any voltage coupled to them will be common mode and differentially subtract out. This remains true even though there may be no significant common mode coupling current.

Another power source 136 (e.g., separate from power source 122) can be disposed at the second location 120 configured to power the one or more gate drivers 106 locally and independent from the power source 122 at the first location 118, such that common mode noise is prevented from coupling between the switching domain 134 and the controller 104.

In embodiments, the first isolation coupling 124 can be physically closer on the PCB 102 to the first location 118 than to the second location 120 and the second isolation coupling 132 can be physically closer on the PCB 102 to the second location 120 than to the first location 118. While shown relatively close together in FIG. 1 for clarity, it should be understood that the stacked trace 130 spanning the isolation domain 112 can be configured to traverse any distance and follow any suitable path along the PCB 102 between the controller 104 and the gate driver 106 as needed or desired for a given application. Moreover, in embodiments, it is possible to locate the first isolation coupling 124 in close proximity to the controller 104, and the second isolation coupling 132 in close proximity to the one or more gate drivers 106, without regard to the physical distance between the two isolation couplings 124, 132, or any intervening components therein.

In embodiments, the first moat 114 is at the same point on the PCB 102 where the power supply 124 and return for the main controller 104 ends, for example as shown in FIG. 1. The supply for the main controller 104, the return, and the first moat 114 all stack up exactly on top of each other so there is no parasitic capacitance bridging any moat 114, 116 and the main controller 104 is powered only from power in it's own reference domain (e.g., by a local power source 122) and only has signals routed from/to it in it's own reference domain. Additionally, in the switching domain 134, at the second moat 116 should end at the exact location where the gate power supply 136 and it's return meet the area where the high voltage and return start and right under the middle of first isolation coupling 124. Such an arrangement allows the gate driver 106 and the gate to all referenced to the source 108 of the transistor 110.

In traditional systems, an isolated moat may be included, however, it may be located in an inconvenient location for the given application, which may require extensive routing of the trace across the PCB, which can make the signal more susceptible to picking up common and differential noise. Previously, in order to prevent switching noise from coupling back into the gate control signals and upsetting the converter operation, the signals could be placed between shielding signals with single isolation, however, this solution did not address the mechanical and electrical constraints on the converter, making such an approach difficult to implement, or in some cases, still result in some noise coupling onto the gate lines because the single ended signals were still crossing through noisy areas of the PCB through asymmetrical noise fields.

Embodiments as described herein provide an enhanced solution that addresses the noted constraints of the traditional systems. Embodiments includes two isolation couplings at individual isolation moats, to run the isolated signals differentially, and as a pair, over the two moats. The differential pairs of signals can include—in the stackup from bottom to top—an isolated signal that is referenced to ground, a negative gate drive signal, a positive gate drive signal, and an isolated ground signal, to form a stripline setup. In this way, the gate drive signals are shielded top and bottom, and any common mode noise will be cancelled out by the differential pairing of the signals. Additionally, in embodiments, the second isolation coupling can be very close (e.g., physically close) to the gate driver and the switch on the PCB.

Embodiments disclosed herein provide a system and method to better protect the gate drive control signals from picking up noise as the signals cross through the main power switching area of the converter. It should be understood that the return side of the gate drive control signals is every bit as critical for noise immunity as the gate drive signal itself. To further reduce noise pickup in the signals, embodiments utilize a double isolation coupling configuration with floating differential drive signals (e.g., as shown). By having the double split reference domains the signals and their reference at the controller never leave the area of the POS3R3V power and ground and equivalently any voltage noise the isolated lines see never leaves or enters the isolated area of the Gate/Source reference.

The isolated floating differential section (e.g., isolation domain 112) can be used from the edge of the POS3R3V domain across and through the switching array where the signals are more susceptible to noise. For example, in certain application, the switching domain can be at a very high voltage, such as 270V or more, which can produce high dv/dt transients, leading to strong, high frequency fields and resulting in oscillations in the gate drive signals as they pass through the switching array. These oscillations then create even worse noise that lasts much longer and can couple through any capacitive path back to the controller and all over the module. But by floating the isolation domain and differentially pairing the signals (e.g., in embodiments described herein), there is nothing to create a noisy imbalance between the differential pair since the reference is floating at the same potential as the common mode voltage of the differential pair, and because the routing is arranged so that the four signals are stacked (e.g., in trace 130). As described, the floating reference domain can be on the bottom range of the stackup, then the negative differential signal above that, then the positive differential signal above that, and finally with the floating POSV on top of the stack.

This makes a four layer stackup section that is set either to the top layers of the board or the bottom ones, but in either case completely separate vertically from the switching layers. By having the first isolation coupling also include a floating isolated power converter, then the floating isolation domain has no physical connection to either the controller side domain or the switching domain.

Finally, the differential receiver and isolation to the gate driver allows the transition to the switch source voltage level including the high side gate that is at a high voltage without coupling any of that voltage or noise back into the differential pair area. In embodiments, this can be done right at the entrance to a small floating switch source reference plane that is flowed with a copper pour area under the gate driver section.

With these two isolation couplings (e.g., couplings 124, 132) as described in place, there is no opportunity for noise to couple from the high voltage switching section back to the low voltage controller, even on the return side. Embodiments, therefore allow for more convenient routing without picking up the noise from the high power switching, and without having to tweak each component and location and route on the board to otherwise cancel or prevent such noise. Accordingly, embodiments allow for a much more complex board design with longer distances between the controller and switching sections surrounding the described system and its stacked trace.

Embodiments disclosed herein (e.g., as shown) can be suitable for a half bridge rectifier design, however, certain embodiments can be suitable a full bridge rectifier design, wherein additional isolation couplings and differential pairs, and gate drivers could be included for each side of each additional switch. For example, embodiments for a full bridge rectifier can include four gate drivers, and two isolation couplings for each side of each transistor, where each gate of each transistor includes its own isolation domain and noise control system 200, 300, 400, 500 as shown. For example, as shown schematically in FIG. 1, the novel noise control system indicated as block 200, can be repeated throughout the board as needed for the given board and converter design, as shown by blocks 300, 400, 500. Any suitable number of noise control system blocks, 200, 300, 400, 500 and so on, and accompanying transistors may be included as needed or desired.

In certain applications, such as for use with a three phase AC motor, could include 12-16 gate drivers, and complimentary isolation couplings as described, as the number of switches increases. As more gate drivers and components are added, the board can become more complex, providing for more opportunity for noise, however, using the systems and methods as described herein, the gate drive signals even on the more complex boards should be immune to noise and signal oscillation, easing the design constraints while designing complex boards.

Embodiments can provide a complete barrier to any noise that would normally couple from the switching power section back to the low voltage controller. The double isolation of the described embodiments can be much better suited to be able to support much higher switching voltages and currents, while still controlling for noise in the system. Traditional single isolation systems may fail to block noise as the magnitudes of the voltages and currents increase and as a single isolation system results in one end of the other of the connecting traces between the controller and gate being referenced to either the gate return which may be riding on top of a high voltage square wave or to the controller end which is low voltage and sensitive to any capacitive pickup of noise along path to the controller, for example as present trends indicate aircraft power will require much higher voltages as the technology develops.

As will be appreciated by those skilled in the art, aspects of the present disclosure may be embodied as a system, method or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the apparatus and methods of the subject disclosure have been shown and described, those skilled in the art will readily appreciate that changes and/or modifications may be made thereto without departing from the scope of the subject disclosure.

What is claimed is:

1. A system, comprising:
a printed circuit board (PCB);
a controller disposed at a first location on the PCB and configured to output a gate drive signal to one or more gate drivers to drive a gate of a switch, the one or more gate drivers disposed at a second location on the PCB, the second location being remote from the first location;
an isolation domain comprising first and second moats defined in the PCB and disposed between the controller and the one or more gate drivers, the first and second moats configured to prevent common mode or differential noise in the gate drive signal; and
a power source configured to provide a power signal to the isolation domain at the first moat;
wherein the isolation domain further comprises a first isolation coupling at the first moat, the first isolation coupling configured to:
receive the gate drive signal from the controller and split the gate drive signal into a positive differential gate drive signal and a negative differential gate drive signal to form a first differential pair; and
receive the power signal from the power source and split the power signal into an isolated ground reference power signal and an isolated power signal to form a second differential pair.

2. The system of claim 1, wherein the power source is integrated with the first isolation coupling as an integrated circuit.

3. The system of claim 1, further comprising:
a first trace pair defined in the PCB between the first moat and the second moat, the first trace pair configured to carry at least the first differential pair; and
a second trace pair defined in the PCB between the first moat and the second moat, the second trace pair configured to carry at least the second differential pair.

4. The system of claim 3, wherein the first and second trace pairs comprise stacked traces.

5. The system of claim 4, wherein the stacked traces are configured to carry the positive differential gate drive signal, the negative differential gate drive signal, the isolated ground reference power signal, and the isolated power signal.

6. The system of claim 5, wherein the isolated ground reference power signal is carried at a bottom of the stacked traces, the negative differential gate drive signal is carried atop the isolated ground reference power signal, the positive differential gate drive signal is carried atop the negative differential gate drive signal, and the isolated power signal is carried at a top of the stacked traces.

7. The system of claim 6, further comprising:
a second isolation coupling at the second moat and operatively connected to the first isolation coupling across the isolation domain, wherein the second isolation coupling is configured to:
receive the first and second differential pairs;
combine the first differential pair back into a single gate drive signal; and
return the isolated ground reference power signal to the first isolation coupling.

8. The system of claim 7, further comprising:
a switching domain comprising the one or more gate drivers;
wherein one of the one or more gate drivers is operatively connected to the second isolation coupling and is configured to receive the single gate drive signal to drive the gate of the switch.

9. The system of claim 8, further comprising:
a second power source configured to power the one of the one or more gate drivers locally.

10. The system of claim 9, wherein the first isolation coupling is physically closer on the PCB to the first location than to the second location.

11. The system of claim 9, wherein the second isolation coupling is physically closer on the PCB to the second location than to the first location.

12. The system of claim 1, wherein the isolation domain represents a floating isolation domain.

13. The system of claim 12, further comprising:
a set of traces defined in the PCB spanning the isolation domain from the first isolation coupling to a second isolation coupling at the second moat, the set of traces configured to carry the gate drive signal from the controller to the one or more gate drivers, wherein the set of traces includes at least a four layer stacked trace such that the gate drive signal is sandwiched within the four layer stacked trace.

14. The system of claim 1, further comprising:
a set of traces defined in the PCB spanning the isolation domain from the first isolation coupling to a second isolation coupling at the second moat, the set of traces configured to carry the gate drive signal from the controller to the one or more gate drivers, wherein the set of traces includes at least a four layer stacked trace such that the gate drive signal is sandwiched within the four layer stacked trace.

15. A system, comprising:
a printed circuit board (PCB);
a controller on the PCB and configured to output a gate drive signal to one or more gate drivers to drive a gate of a switch; and
an isolation domain comprising first and second moats defined in the PCB and disposed between the controller and the one or more gate drivers, the isolation domain configured to prevent common mode or differential noise in the gate drive signal;
wherein the isolation domain represents a floating isolation domain.

16. The system of claim 15, wherein common mode noise is prevented from coupling between a switching domain at a second location on the PCB and the controller, the switching domain comprising the one or more gate drivers.

17. The system of claim 15, wherein:
the controller is disposed at a first location on the PCB;
the one or more gate drivers are disposed at a second location on the PCB, the second location being remote from the first location; and
the system further comprises a power source configured to provide a power signal to the isolation domain at the first moat.

18. A system, comprising:
a printed circuit board (PCB);
a controller on the PCB and configured to output a gate drive signal to one or more gate drivers to drive a gate of a switch;
an isolation domain comprising first and second moats defined in the PCB and disposed between the controller and the one or more gate drivers, the isolation domain configured to prevent common mode or differential noise in the gate drive signal; and
a set of traces defined in the PCB spanning the isolation domain from a first isolation coupling at the first moat to a second isolation coupling at the second moat, the set of traces configured to carry the gate drive signal from the controller to the one or more gate drivers, wherein the set of traces includes at least a four layer stacked trace such that the gate drive signal is sandwiched within the four layer stacked trace.

19. The system of claim 18, wherein the isolation domain represents a floating isolation domain.

20. The system of claim 18, wherein:
the controller is disposed at a first location on the PCB;
the one or more gate drivers are disposed at a second location on the PCB, the second location being remote from the first location; and
the system further comprises a power source configured to provide a power signal to the isolation domain at the first moat.

* * * * *